(12) United States Patent
Kannan

(10) Patent No.: US 8,196,082 B1
(45) Date of Patent: Jun. 5, 2012

(54) SIGNAL ROUTING AND PIN PLACEMENT

(75) Inventor: Parivallal Kannan, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 31 days.

(21) Appl. No.: 12/946,106

(22) Filed: Nov. 15, 2010

(51) Int. Cl.
*G06F 9/455* (2006.01)
*G06F 17/50* (2006.01)

(52) U.S. Cl. ......... 716/126; 716/113; 716/129; 716/130

(58) Field of Classification Search ............... 716/113, 716/126, 129, 130
See application file for complete search history.

(56) References Cited

U.S. PATENT DOCUMENTS

| | | | |
|---|---|---|---|
| 5,666,408 A * | 9/1997 | Lao | 379/442 |
| 7,058,915 B1 | 6/2006 | Singh et al. | |
| 7,992,119 B1 * | 8/2011 | Iotov et al. | 716/119 |
| 8,079,013 B1 * | 12/2011 | Ma et al. | 716/139 |
| 2004/0216075 A1 * | 10/2004 | Nelson et al. | 716/18 |
| 2007/0150846 A1 * | 6/2007 | Furnish et al. | 716/8 |

OTHER PUBLICATIONS

Cormen, Thomas H., "Section 26.2: The Ford-Fulkerson Method," *Introduction to Algorithms*, Second Ed., Sep. 1, 2001, pp. 587-599, MIT Press, Cambridge, Massachusetts, USA.
Wikipedia, *Ford-Fulkerson algorithm*, Sep. 4, 2010, pp. 1-6, Wikipedia, Sep. 24, 2010, <http://en.wikipedia.org/wiki/Ford-Fulkerson_algorithm>.

* cited by examiner

*Primary Examiner* — Suresh Memula
(74) *Attorney, Agent, or Firm* — LeRoy D. Maunu; Lois D. Cartier

(57) ABSTRACT

A method is provided for assigning signals to input pins of a component subject to asymmetric delays. A latency is determined for each signal-pin combination of the plurality of signals and plurality of input pins. The latency is determined as a function of an arrival time of the signal, a time to route the signal from to the input pin, and a time attributable to processing by the component. A latency threshold is selected. Signal to pin assignments using only signal-pin combinations having latencies less than or equal to the latency threshold are analyzed to determine if a one-to-one signal-to-pin assignment exists that includes all signals. The latency threshold is increased and the analysis is repeated until a valid one-to-one signal-to-pin assignment is found.

14 Claims, 4 Drawing Sheets

SIGNAL ROUTING AND PIN PLACEMENT

FIELD OF THE INVENTION

One or more embodiments generally relate to circuit design, and more particularly to signal routing and pin placement.

BACKGROUND

Integrated circuits have become increasingly complex and heterogeneous. Modern circuit designs can include a variety of different components or resources including, but not limited to, registers, block Random Access Memory (RAM), multipliers, processors, and the like. This increasing complexity makes placement of components as well as the routing of signals within a circuit design more cumbersome.

Circuitry within components may have asymmetric propagation or processing delays for different inputs. That is, a signal at one input pin may have a substantially different propagation delay to the component output than a signal at another of the input pins. The throughput of the component is determined by the signal having the largest overall delay from component input to output. As a consequence, the processing time required by the component is increased when late arriving signals are assigned to pins having large processing delays. By reordering assignment of signals to pins during pin placement, pins having large processing delays can be matched with early arriving signals to reduce the longest delay, which dictates the overall delay of the component.

Previous analysis and placement methods sort signals by arrival time and pins by processing delay. Signals with the earliest arrival are assigned to pins having the longest processing delay. In doing so, the time in which output becomes available can be improved. However, this method of assignment may not yield optimal results in some cases. One or more embodiments may address one or more of the above issues.

SUMMARY

In one embodiment, a method is provided for assigning a plurality of signals of a circuit design to a plurality of input pins of a component subject to asymmetric delays. A respective latency is determined for each signal-pin combination of the plurality of signals and plurality of input pins. The latency is determined as a function of an arrival time of the signal at a respective driver pin, a transit delay time to route the signal from the respective driver pin to the input pin, and a processing delay time attributable to processing by the component of a signal received by the input pin. A first one of the respective latencies is selected as a latency threshold. Signal to pin assignments are analyzed to determine whether a one-to-one signal-to-pin assignment exists that includes the plurality of signals and includes only signal-pin combinations having latencies less than or equal to the latency threshold. In response to determining that a one-to-one signal-to-pin assignment, which includes the plurality of signals and includes only signal-pin combinations having latencies less than or equal to the latency threshold, does exist, the one-to-one signal-to-pin assignment is stored.

In another embodiment, a method of assigning a plurality of signals of a circuit design to input pins of a component having asymmetric delays is provided. A first matrix and a second matrix are received. The first matrix indicates respective arrival times at which each of the plurality of signals is received by a respective driver pin. The second matrix indicates, for each of the plurality of signals, a propagation delay incurred between the corresponding driver pin and each of the plurality of input pins of the component.

The first matrix is summed with each row of the second matrix to produce a third matrix indicating a latency of each signal-pin combination of the plurality of signals and plurality of input pins. A first one of the latencies in the third matrix is selected as a latency threshold. The highest number of signals that can be matched to input pins in a one-to-one matching using only signal-pin combinations having a latency less than the latency threshold is determined. In response to the highest number of signals that can be matched to pins in a one-to-one matching being less than the number of the plurality of signals, the latency threshold is increased to another one of the latencies in the third matrix and the operation of determining the highest number of signals that can be matched is repeated for the increased latency threshold. In response to the highest number of signals that can be matched to pins in a one-to-one matching being greater than or equal to the number of the plurality of signals, the signal-pin combinations included in the highest number of signals are stored.

In yet another embodiment, a system is provided for assigning a plurality of signals to input pins of a component having asymmetric delays. The system includes one or more processors and a memory arrangement coupled to the one or more processors. The memory arrangement is configured with instructions that when executed cause the one or more processors to determine a respective latency of each signal-pin combination of the plurality of signals and plurality of input pins. Each latency is determined as a function of an arrival time of the signal at its driver pin, a transit delay time to route the signal from a driver pin to the input pin of the component, and a processing delay time attributable to propagation delay from inputs of the component to outputs of the component. The instructions further cause the one or more processors to select a first one of the respective latencies as a latency threshold and determine whether a one-to-one signal-to-pin assignment exists that includes the plurality of signals and includes only signal-pin combinations having latencies less than or equal to the latency threshold. The instructions cause the processors, in response to determining that a one-to-one signal-to-pin assignment does not exist that includes the plurality of signals and includes only signal-pin combinations having latencies less than or equal to the latency threshold, to increase the latency threshold to another one of the respective latencies and repeat the operation of determining whether a one-to-one signal-to-pin assignment exists for the increased latency. The instructions also cause the one or more processors, in response to determining that a one-to-one signal-to-pin-assignment exists that includes the plurality of signals and includes only signal-pin combinations having latencies less than or equal to the latency threshold, to store the one-to-one signal-to-pin assignment.

It will be appreciated that various other embodiments are set forth in the Detailed Description and Claims, which follow.

BRIEF DESCRIPTION OF THE DRAWINGS

Various aspects and advantages of the disclosed embodiments will become apparent upon review of the following detailed description and upon reference to the drawings, in which.

DETAILED DESCRIPTION

Electronic circuit components may have asymmetric propagation or processing delays for different inputs. That is, a signal at one input pin may have a substantially different propagation delay to the component output than a signal at another of the input pins. To reduce the longest delays, which limit throughput, previous placement methods reassigned signals to pins by sorting signals by arrival time and pins by processing delay and reassigning earliest arriving signals to input pins having the longest delay. However, the reassigning of signals to different input pins requires rerouting of the signals, and the rerouting of a signal changes the delay incurred in routing to the input pin, because the signal is routed along a different path using different routing resources. Because these previous methods do not account for delay caused by the rerouting of signals, optimal pin assignment is not assured. One or more embodiments provide an accurate method and system that accounts for asymmetric delays arising from the rerouting of the signals to the input pins in assigning signals to pins.

For ease of explanation and illustration, the disclosed embodiments and examples are primarily described in relation to a look-up-table (LUT) having asymmetric input pin delays. One skilled in the art will recognize that the embodiments may be used to assign signals to pins of other components having asymmetric delays as well.

Figure 1:
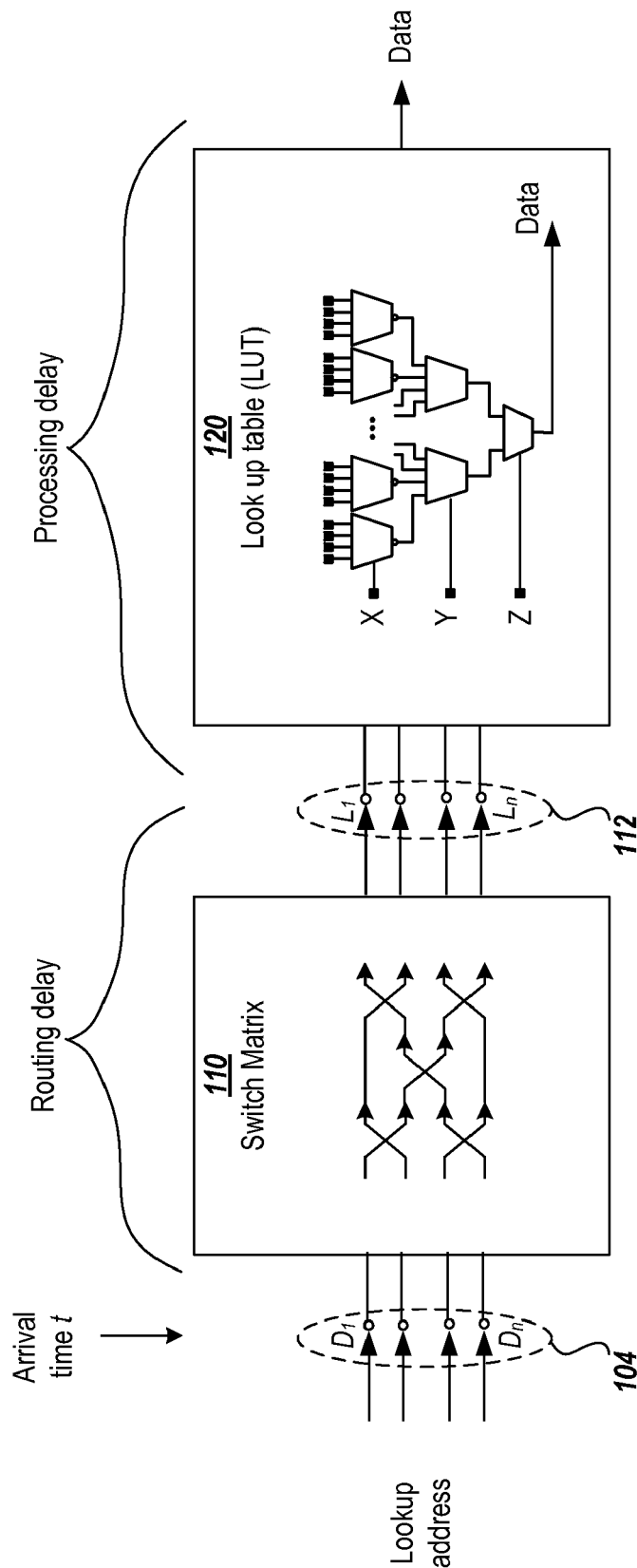
FIG. 1 illustrates the sources of asymmetric delay in an example circuit subject to asymmetric delays.

FIG. 1 illustrates the sources of asymmetric delay in an example lookup table (LUT) circuit 120. The example LUT 120 has three address input pins X, Y, and Z. Different data paths taken by the different address inputs in the LUT create different delays. For example, assuming each multiplexer (MUX) of the LUT 120 has a propagation delay of one time unit, then a signal received on input pin X requires two time units to reach the lowest level MUX. In contrast, input Z has zero time units of delay to reach the same point because the value is input directly to the lowest MUX. Because a signal at pin X incurs 2 units of delay, a signal at Z may arrive up to 2 time units after X without adding to the latency of the LUT circuit. The asymmetric delay incurred from data paths within a circuit may be referred to herein as processing delay.

In addition to the processing delays, there may be asymmetric delays for the signals due to processing and/or routing of the signals prior to arriving at the input pins, or due to routing a received signal to input pins of the component (transit delay). In this example, delay incurred from previous processing and routing is accounted for by the arrival time of each signal at driver pins $D_1$ through $D_n$ (104) of switch circuit 110. The received signals are routed by switch circuit 110 according to a pin assignment and then output on load pins $L_1$ through $L_n$ (112). The load pins are coupled directly to input pins of the LUT 120 and such terms may be used interchangeably herein. The routing performed by the switch circuit 110 introduces different delays for signals appearing at driver pins 104. For example, a signal, arriving at the driver pin $D_1$ and routed by the switch circuit to each of the load pins 112, may arrive at different ones of the load pins at different times. The different delays are due to the variations in the lengths and types of routing paths used to route the signals to the different input pins. Therefore, signal and pin assignment can affect the delay incurred by each input signal. The total delay for each signal-pin combination can be modeled as the sum of arrival time, routing time, and processing time.

Figure 2:
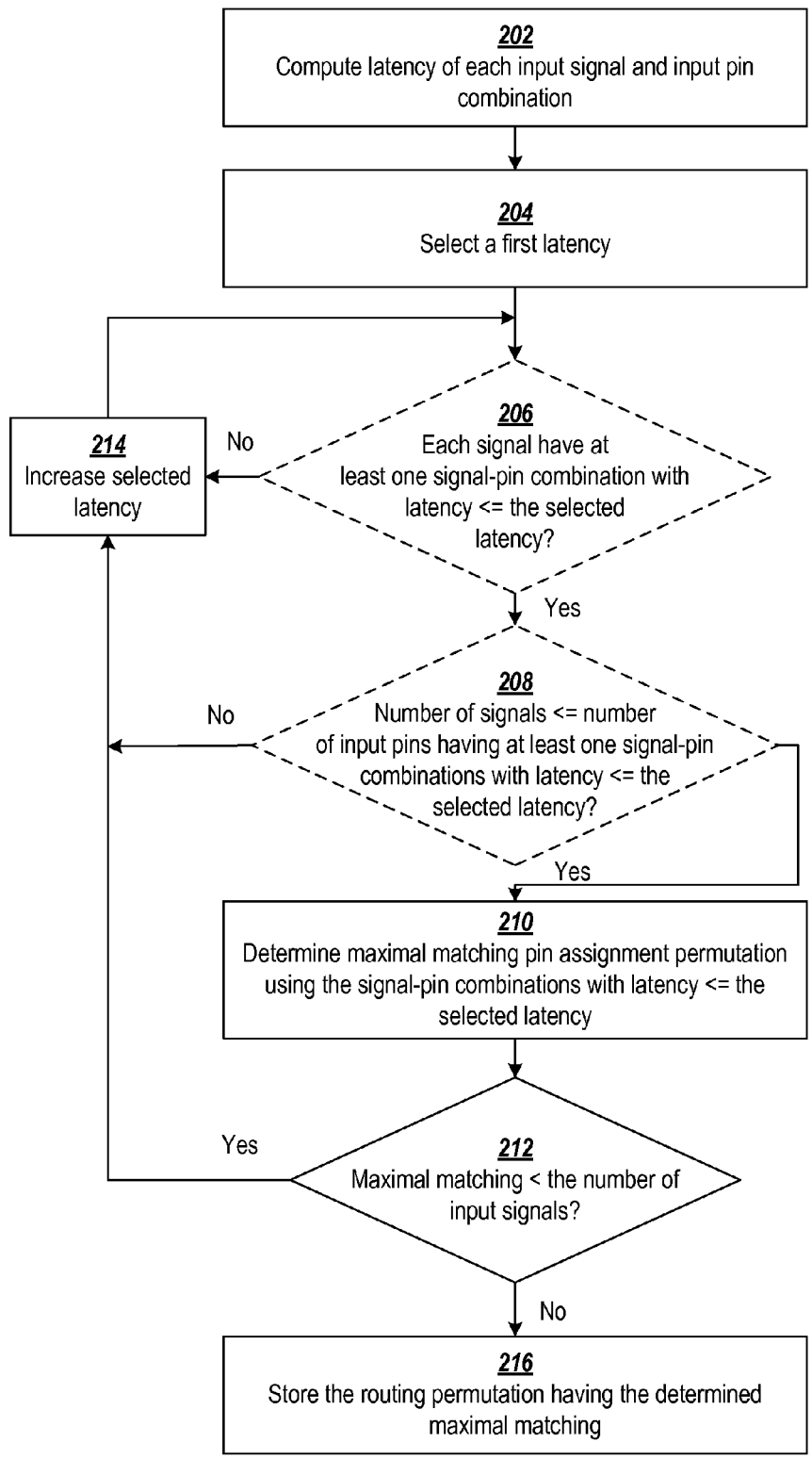
FIG. 2 shows a flowchart of an example process for determining optimal pin assignment in accordance with one or more embodiments.

FIG. 2 shows a flowchart of an example process for determining optimal pin assignment. A latency value is computed for every combination of an input signal and an input pin at process block 202. As used herein, the combinations of an input signal and an input pin are referred to as signal-pin combinations. The latency reflects the total delay a signal would incur from transit delay and processing delay if assigned to a pin. A first latency is selected at process block 204 and analyzed in subsequent steps to determine whether each signal can be assigned to a respective pin with a latency less than the selected latency. The latency may be selected according to a number of search algorithms, which are discussed further below. Decision blocks 206 and 208 relate to an alternative embodiment and are discussed in further detail below. The blocks are shown with dashed lines to indicate that the operations are not required for some embodiments. At process blocks 210 and 212, the process determines if a valid pin assignment exists for all signals using only signal-pin combinations having latencies not exceeding the latency selected at process block 204.

At block 210, a maximal matching of pin assignment permutations is determined using signal-pin combinations with latencies meeting the selected latency. The maximal matching indicates the maximum number of signals that can be exclusively matched with respective input pins using available signal-pin combinations. If modeled as a bipartite graph of signals connected to input pins, a matching M refers to a set of edges with the property that no two of the edges have an endpoint in common. The matching is maximum if there is no matching that has a greater number of connections.

If the maximal matching is less than the number of input signals as determined at decision block 212, the selected latency is increased at process block 214, and signal-pin permutations are analyzed to find a valid pin assignment at process block 210. This process repeats until a maximal matching equal to the number of signals is found at decision block 212, after which, the routing permutation having the maximal matching is stored at process block 216.

In some embodiments, preliminary tests may be performed at decision blocks 206 and 208 to identify selected latencies in which there are insufficient signal-pin combinations available to yield a valid pin assignment for all signals. For example, the process may check to ensure that for each signal, there is at least one signal-pin combination having a latency value less than or equal to the selected latency. If no pin assignment can meet the latency requirements for a signal, other permutations of different signal-pin combinations need not be checked at process block 210.

Likewise, if the number of pins having at least one signal-pin combination with a suitable latency is less than the number of signals, pin assignment will not be possible for all signals. This condition can be determined at decision block 208. A valid pin assignment, may not include all input pins. For example, a circuit design may only utilize three of four pins of a component. Other preliminary tests may be performed as well to avoid unnecessary processing.

In this example, latencies are selected in a linear fashion, where latency is increased and checked until a minimal matching is found. In some embodiments, more advanced search algorithms may be implemented to minimize the number of determined latencies that are checked before an optimal matching is found. For example, in one embodiment, unique latencies may be sorted in an ordered list and selected using a divide-and-conquer search algorithm.

In one divide-and-conquer algorithm, known as binary search, the middle latency in the search space is selected and checked. If the middle latency does not produce a maximal matching equal to the number of signals, it can be inferred that a larger latency is needed. Therefore, latencies in the sorted list less than the middle latency can be removed. Likewise, if a maximal matching that includes each signal is found at the middle latency, higher latencies can be removed from the sorted list. The binary search algorithm continues to iteratively select and check the middle latency of the sorted list, and reduce the size of the list until only one latency remains. In each iteration, after latencies are removed from the list, the selected threshold latency is increased or decreased to the value of the middle latency in the updated sorted list. If the half of the list containing smaller latencies is removed, updating the latency threshold to the new middle latency increases the latency threshold. Likewise, if the half of the list containing larger latencies is removed, updating the latency threshold to the new middle latency decreases the latency threshold. The last remaining latency is the lowest latency threshold that produces a maximal matching equal to the number of signals. In this manner, the latency search space is reduced by half each time a latency value is selected as the latency threshold. One skilled in the art will recognize that other search algorithms may be implemented as well to improve performance.

One skilled in the art will recognize that the maximal matching performed at process block 210 may be determined using a number of methods. In an example implementation, the maximal matching may be determined by modeling the signals and pins as a bipartite flow network and determining the maximum network flow using the Ford-Fulkerson method. The number of signal-pin connections in the matching having the maximal flow is the maximal matching.

Figure 3:
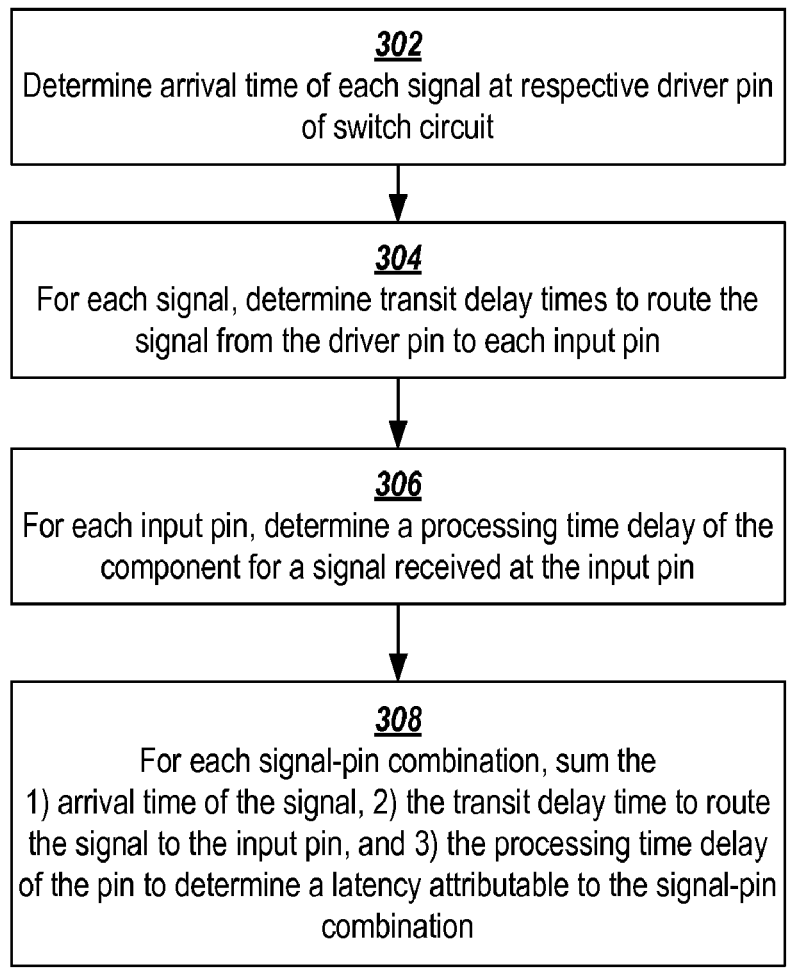
FIG. 3 shows a flowchart of an example process for the determination of the latency of each signal-pin combination.

FIG. 3 shows a flowchart of an example process for the determination of the latency of each signal-pin combination (FIG. 2, 202). The arrival time of each signal at its respective driver pin of the switch circuit is determined at block 302. For each signal, transit delay times to route the signal from the driver pin to each input pin are determined at block 304. For each input pin, a processing time delay of the component is determined at block 306. For each signal-pin combination, at block 308 the process sums the 1) arrival time of the signal, 2) the transit delay time to route the signal from the driver pin to the and input pin, and 3) the processing time delay of the pin. The resulting sum is a latency attributable to and associated with the signal-pin combination.

The following discussion illustrates the latency determination of a LUT with four input signals received at respective driver pins and four input pins, for example. Arrival times of signals at the driver pins are given by matrix A. Transit delays to route signals from driver pins to input pins are indicated by matrix T. In matrix T, each column corresponds to a driver pin and each row corresponds to an input pin of the component. Processing delays attributable to input pins are given by matrix P. Examples of matrices A, T, and P are shown below.

$$A = [2\ 2\ 1\ 3]$$

$$T = \begin{vmatrix} 1 & 2 & 9 & 3 \\ 3 & 6 & 8 & 4 \\ 5 & 1 & 8 & 4 \\ 4 & 7 & 9 & 2 \end{vmatrix}$$

$$P = [9\ 6\ 7\ 6]$$

A latency matrix is constructed by adding an expansion of matrix A, matrix T, and an expansion of matrix P. As shown below, the row of arrival time matrix A is replicated to produce matrix A', the row of matrix P is transposed into a column and replicated to produce matrix P', and matrices A', T, and P' are added to produce the latency matrix, L. The matrix addition is shown below.

$$L = \underbrace{\begin{vmatrix} 2 & 2 & 1 & 3 \\ 2 & 2 & 1 & 3 \\ 2 & 2 & 1 & 3 \\ 2 & 2 & 1 & 3 \end{vmatrix}}_{A'} + \underbrace{\begin{vmatrix} 1 & 2 & 9 & 3 \\ 3 & 6 & 8 & 4 \\ 5 & 1 & 8 & 4 \\ 4 & 7 & 9 & 2 \end{vmatrix}}_{T} + \underbrace{\begin{vmatrix} 9 & 9 & 9 & 9 \\ 6 & 6 & 6 & 6 \\ 7 & 7 & 7 & 7 \\ 6 & 6 & 6 & 6 \end{vmatrix}}_{P'} = \underbrace{\begin{vmatrix} 12 & 13 & 19 & 15 \\ 11 & 14 & 15 & 13 \\ 14 & 10 & 16 & 14 \\ 12 & 15 & 16 & 11 \end{vmatrix}}_{L}$$

From the latency matrix L, a list of unique latencies can be determined, e.g., {10, 11, 12, 13, 14, 15, 16, 19}. One of these latencies can be selected, as shown in process block 204 of FIG. 2. In some implementations, a binary latency mask matrix may be generated. The latency mask specifies a binary value for each element of the latency matrix, and the value indicates whether the corresponding latency is less than or equal to the latency threshold. For example, if a latency threshold=14 is selected, the resulting latency mask of L would be equal to matrix M as shown below. In this example, a value of 1 indicates that the latency of the signal-pin combination is less than or equal to the latency threshold and may be used to find a valid pin assignment. A value of 0 indicates the latency is greater than the latency threshold and the signal-pin combination may not be used.

$$M = \begin{vmatrix} 1 & 1 & 0 & 0 \\ 1 & 1 & 0 & 1 \\ 1 & 1 & 0 & 1 \\ 1 & 0 & 0 & 1 \end{vmatrix}$$

As discussed above, the mask matrix M may be used to perform preliminary testing to determine if a valid pin assignment is possible. In this case, M indicates that signal 3 (column 3) does not have any signal-pin combinations that have a latency value less than or equal to the latency threshold. As illustrated in FIG. 2, the latency must be increased before a valid solution may be found. As the smallest latency in the third column (matrix L), 15 is the smallest latency threshold that may produce a solution. Visually, a maximal matching can easily be found for this simple example with a latency threshold of 15. One possible maximal matching is highlighted in matrix L below, with the first occurrence of 12 being highlighted in the first column, 10 in the second column, 15 in the third column, and 11 in the fourth column.

$$L = \begin{vmatrix} \mathbf{12} & 13 & 19 & 15 \\ 11 & 14 & \mathbf{15} & 13 \\ 14 & \mathbf{10} & 16 & 14 \\ 12 & 15 & 16 & \mathbf{11} \end{vmatrix}$$

The matrices above illustrate how the embodiments improve over the prior method of pin assignment. Using a prior method of pin assignment, the earliest signal A(3)=1 would be matched to the input pin having the longest processing delay P(1)=9. However, transit delays (column 3 of T matrix) to route from the driver pin A(3) to input pins are high (8 or 9). When transit delay is taken into account, this signal-pin combination 3:1 (column 3, row 1) has the largest latency (i.e., 19) for the signal (indicated by column 3 of matrix L). In contrast, the one or more embodiments reduce the largest latency to a value of 15 (column 3, row 2). One skilled in the art will recognize that these delay values are for illustrative purposes only and may not be proportionate to actual delays.

Figure 4:
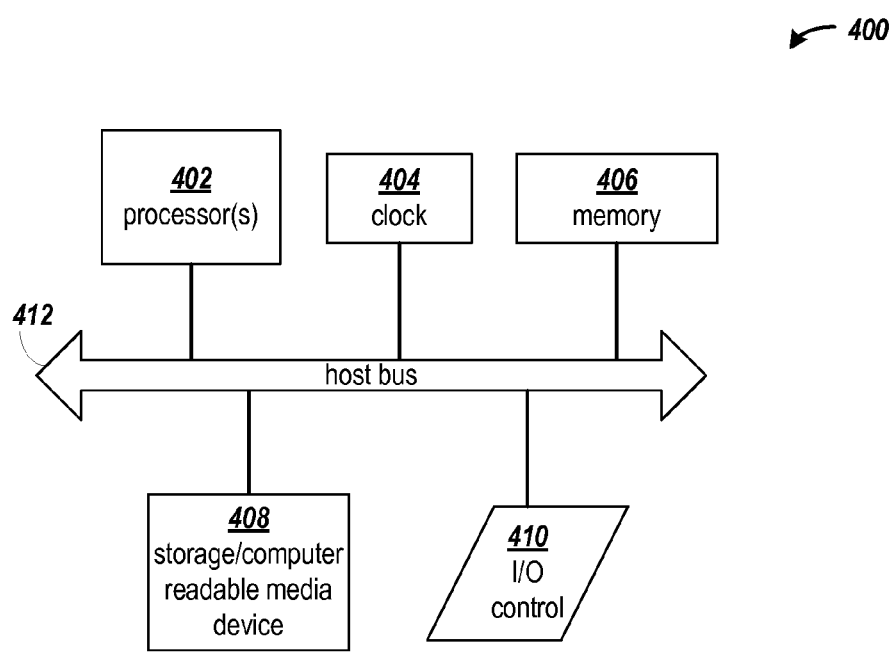
FIG. 4 illustrates a block diagram of a general-purpose processor computing arrangement for implementing the processes described herein.

FIG. 4 illustrates a block diagram of a computing arrangement that may be configured to implement the pin assignment processes described herein. Those skilled in the art will appreciate that various alternative computing arrangements, including one or more processors and a memory arrangement configured with program code, would be suitable for hosting the processes described herein, along with data structures for organizing the required data. The computer code is encoded in a processor executable format and may be stored on and/or provided via a variety of computer-readable storage media or delivery channels such as magnetic or optical disks or tapes, electronic storage devices, or as application services over a network.

Processor computing arrangement 400 includes one or more processors 402, a clock signal generator 404, a memory unit 406, a storage unit 408, and an input/output control unit 410 coupled to host bus 412. The arrangement 400 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 402 may be one or more general purpose processors, or a combination of one or more general purpose processors and suitable co-processors, or one or more specialized processors (e.g., RISC, CISC, pipelined, etc.).

The memory arrangement 406 typically includes multiple levels of cache memory and a main memory. The storage arrangement 408 may include local and/or remote persistent storage such as provided by magnetic disks (not shown), flash, EPROM, or other non-volatile data storage. The storage unit may be read or read/write capable. Further, the memory 406 and storage 408 may be combined in a single arrangement.

The processor arrangement 402 executes the software in storage 408 and/or memory 406 arrangements, reads data from and stores data to the storage 408 and/or memory 406 arrangements, and communicates with external devices through the input/output control arrangement 410. These functions are synchronized by the clock signal generator 404. The resource of the computing arrangement may be managed by either an operating system (not shown), or a hardware control unit (not shown).

Those skilled in the art will appreciate that various alternative computing arrangements, including one or more processors and a memory arrangement configured with program code, would be suitable for hosting the processes and data structures of the different embodiments.

The present invention is thought to be applicable to a variety of systems for a placement and routing of circuit designs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of assigning a plurality of signals of a circuit design to a plurality of input pins of a component having asymmetric delays, the method comprising:
   using at least one processor programmed to perform operations including:
      determining a respective latency of each signal-pin combination of the plurality of signals and plurality of input pins as a function of:
         an arrival time of the signal at a respective driver pin;
         a transit delay time to route the signal from the respective driver pin to the input pin; and
         a processing delay time attributable to processing by the component of a signal received by the input pin;
      selecting a first one of the respective latencies as a latency threshold;
      determining whether a one-to-one signal-to-pin assignment exists that includes the plurality of signals and includes only signal-pin combinations having latencies less than or equal to the latency threshold; and
      in response to determining that a one-to-one signal-to-pin assignment that includes the plurality of signals and includes only signal-pin combinations having latencies less than or equal to the latency threshold exists, storing the one-to-one signal-to-pin assignment.

2. The method of claim 1, wherein the processor is further programmed to perform operations including, in response to determining that a one-to-one signal-to-pin assignment that includes the plurality of signals and includes only signal-pin combinations having latencies less than or equal to the latency threshold does not exist:
   increasing the latency threshold to another one of the respective latencies; and
   repeating the operation of determining whether a one-to-one signal-to-pin assignment exists using the increased latency threshold.

3. The method of claim 1, wherein the determining whether a one-to-one signal-to-pin assignment exists includes:
   determining a maximal matching of signal-pin combinations having latencies less than or equal to the latency threshold; and
   determining whether the determined maximal matching is equal to the number of signals.

4. The method of claim 2, wherein the selecting the first one of the respective latencies as the latency threshold includes:
   determining a sorted list of unique latencies of the determined latencies of the signal-pin combinations of the plurality of signals and plurality of input pins; and
   selecting the first one of the respective latencies from the sorted list.

5. The method of claim 4, wherein the operations of selecting the first one of the respective latencies and increasing the latency threshold to another one of the respective latencies select the latencies from the sorted list of unique latencies according to a divide-and-conquer search algorithm.

6. The method of claim 5, wherein the processor is further programmed to perform operations including:
   in response to determining that a one-to-one signal-to-pin assignment exists:
      decreasing the latency threshold to another one of the respective latencies; and
      repeating the operation of determining whether a one-to-one signal-to-pin assignment exists using the decreased latency threshold; and
   wherein the storing operation is responsive to determining the latency threshold is the lowest latency threshold in which a one-to-one signal-to-pin assignment exists that includes the plurality of signals and includes only signal-pin combinations having latencies less than or equal to the latency threshold.

7. The method of claim 1, wherein the processor is further programmed to perform operations including:
   determining a subset of the signal-pin combinations having latencies less than or equal to the latency threshold; and
   in response to the subset not including each of the plurality of signals in at least one respective signal-pin combination, increasing the latency threshold to another latency of the signal-pin combinations.

8. The method of claim 7, wherein the processor is further programmed to perform operations including:
   determining a subset of the plurality of input pins that are included in at least one of the subset of the signal-pin combinations; and
   in response to the subset of the plurality of input pins having a cardinality of input pins less than a number of signals that enumerates the plurality of signals, increasing the latency threshold to another latency of the signal-pin combinations.

9. The method of claim 1, wherein the determining whether a signal-to-pin assignment exists analyzes only signal-to-pin assignments that include at least one signal-pin combination having a latency equal to the latency threshold.

10. A system for assigning a plurality of signals to input pins of a component having asymmetric delays, the system comprising:
    a one or more processors; and
    a memory arrangement coupled to the one or more processors, wherein the memory arrangement is configured with instructions that when executed by the one or more processors cause the one or more processors to perform operations including:
      determining a respective latency of each signal-pin combination of the plurality of signals and plurality of input pins as a function of:
        an arrival time of the signal at a respective driver pin;
        a transit delay time to route the signal from the respective driver pin to the input pin; and
        a processing delay time attributable to propagation delay from the input pin to an output pin of the component;
      selecting a first one of the respective latencies as a latency threshold;
      determining whether a one-to-one signal-to-pin assignment exists that includes the plurality of signals and includes only signal-pin combinations having latencies less than or equal to the latency threshold;
      in response to determining that a one-to-one signal-to-pin assignment does not exist that includes the plurality of signals and includes only signal-pin combinations having latencies less than or equal to the latency threshold:
        increasing the latency threshold to another one of the respective latencies; and
        repeating the operation of determining whether a one-to-one signal-to-pin assignment exists using the increased latency threshold; and
      in response to determining that a one-to-one signal-to-pin assignment exists that includes the plurality of signals and includes only signal-pin combinations having latencies less than or equal to the latency threshold, storing the one-to-one signal-to-pin assignment.

11. The system of claim 10, wherein the determining whether a one-to-one signal-to-pin assignment exists includes:
    determining a maximal matching of signal-pin combinations having latencies less than or equal to the latency threshold; and
    determining whether the determined maximal matching is equal to a number that enumerates the plurality of signals.

12. The system of claim 10, wherein the instructions further cause the one or more processors to perform operations including:
    determining a sorted list of unique latencies of the determined latencies of the signal-pin combinations of the plurality of signals and plurality of input pins; and
    wherein the first one of the respective latencies and the another one of the respective latencies are selected from the sorted list of unique latencies according to a divide-and-conquer search algorithm.

13. The method of claim 12, wherein the divide-and-conquer search algorithm is a binary-search algorithm.

14. The method of claim 13, wherein the instructions further cause the one or more processors to perform operations including:
    in response to determining that a one-to-one signal-to-pin assignment exists:
      decreasing the latency threshold to another one of the latencies in the third matrix; and
      repeating the operation of determining whether a one-to-one signal-to-pin assignment exists using the decreased latency threshold; and
    wherein the storing operation is responsive to determining the latency threshold is the lowest latency threshold in which a one-to-one signal-to-pin assignment exists that includes the plurality of signals and includes only signal-pin combinations having latencies less than or equal to the latency threshold.

* * * * *